United States Patent [19]

Bowers et al.

[11] 4,317,689
[45] Mar. 2, 1982

[54] MERCURY CONTAINMENT FOR LIQUID PHASE GROWTH OF MERCURY CADMIUM TELLURIDE FROM TELLURIUM-RICH SOLUTION

[75] Inventors: John E. Bowers, Mountain View, Calif.; Joseph L. Schmit, Hopkins, Minn.

[73] Assignee: Honeywell Inc., Minneapolis, Minn.

[21] Appl. No.: 170,324

[22] Filed: Jul. 18, 1980

[51] Int. Cl.³ .......................................... H01L 21/208
[52] U.S. Cl. .................................... 148/171; 148/172; 118/415
[58] Field of Search ........................ 148/171, 172, 173; 118/415

[56] References Cited

U.S. PATENT DOCUMENTS

| 3,305,412 | 2/1967 | Pizzarello | 148/189 |
| 3,690,965 | 9/1972 | Bergh et al. | 148/172 |
| 3,713,900 | 1/1973 | Suzuki | 148/171 X |
| 3,723,190 | 3/1973 | Kruse et al. | 148/1.5 |
| 3,902,924 | 9/1975 | Maciolek et al. | 148/1.5 |
| 3,933,538 | 1/1976 | Akai et al. | 148/171 |
| 3,997,377 | 12/1976 | Izawa et al. | 148/172 |
| 4,088,514 | 5/1978 | Hara et al. | 148/171 |
| 4,089,714 | 5/1978 | Johnson et al. | 148/188 |
| 4,105,477 | 8/1978 | Johnson et al. | 148/188 X |
| 4,105,479 | 8/1978 | Johnson et al. | 148/189 |
| 4,115,162 | 9/1978 | Pawlik et al. | 148/171 |

Primary Examiner—G. Ozaki
Attorney, Agent, or Firm—Omund R. Dahle

[57] ABSTRACT

$Hg_{1-x}Cd_xTe$ is an important semiconductor for use in photovoltaic and photoconductive infrared photon detectors. $Hg_{1-x}Cd_xTe$ can be grown by liquid phase epitaxy at atmospheric pressure from a Te-rich solution in which case the Hg vapor pressure is below 0.1 atm at 500° C. This low vapor pressure makes possible the use of open-tube, slider growth techniques. The present invention describes a covered graphite slider system which provides an additional source of Hg, minimizes loss of Hg from the source wafer and virtually prevents loss of Hg from the $(Hg_{1-x}Cd_x)_{1-y}Te_y$ growth solution.

7 Claims, 16 Drawing Figures

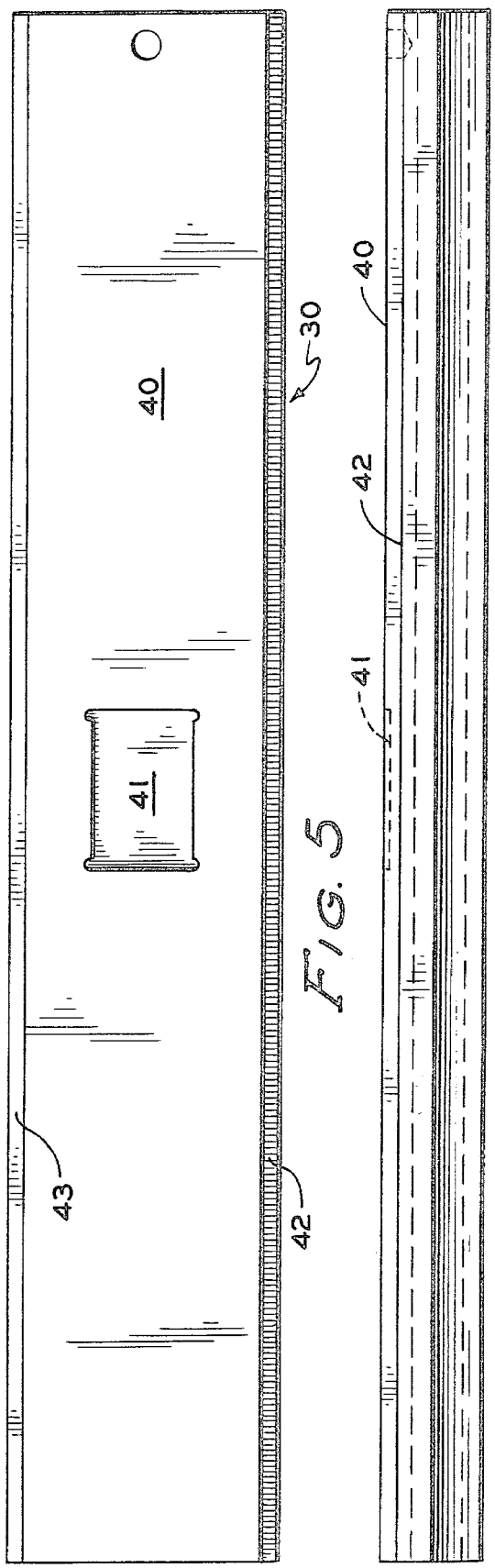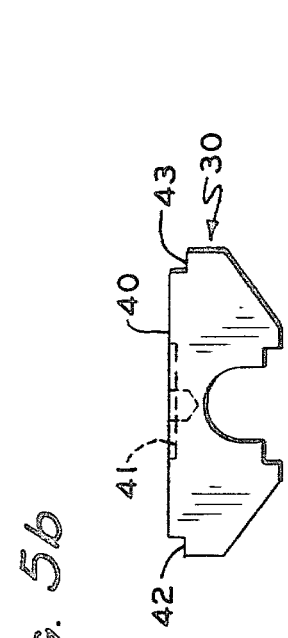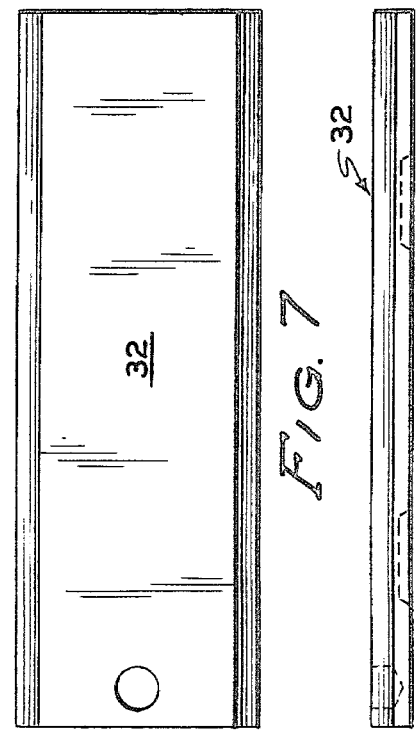

MERCURY CONTAINMENT FOR LIQUID PHASE GROWTH OF MERCURY CADMIUM TELLURIDE FROM TELLURIUM-RICH SOLUTION

The U.S. Government has rights in this invention pursuant to a contract awarded by the Department of Air Force.

BACKGROUND AND SUMMARY OF THE INVENTION

Mercury cadmium telluride $Hg_{1-x}Cd_xTe$ can be grown on CdTe substrates by liquid phase epitaxy from a Te-rich solution at atmospheric pressure, in which case the Hg pressure will be below 0.1 atm for growth temperatures below 500° C. This low pressure makes possible the use of open-tube, slider growth techniques.

Mercury cadmium telluride can be grown by liquid phase epitaxy from solutions of metal (Hg, Cd), of HgTe (along the pseudobinary) or of Te. The schematic He-Cd-Te ternary phase diagram for $Hg_{1-x}Cd_xTe$ is shown in FIG. 1 and three solutions are shown which are in equilibrium with $Hg_{0.6}Cd_{0.4}Te$. Thus such a given composition can be grown from a Te-rich solution (line a), from a Hg-rich solution (line b) or from a HgTe rich solution (along the pseudobinary line c). One practical difference among these approaches is the Hg vapor pressure present in each case. With the Te-rich solution, the Hg vapor pressure is only 0.1 atm at 500° C. The Hg vapor pressure over a Hg rich solution is much higher, that is, 7 atm at 500° C.

Even with a low Hg vapor pressure of 0.1 atm there is a problem that excessive Hg will be lost. Since $H_2$ gas flows through the furnace tube during the entire equilibration and growth process, much Hg vapor is required to saturate the $H_2$ gas during a run. The present invention describes a covered graphite slider system which provides a source of Hg, minimizes loss of Hg from the source wafer and virtually prevents loss of Hg from the growth solution.

BRIEF DESCRIPTION OF THE DRAWINGS

FIGS. 5, 5b and 5c are top, side and end views of the base member of the boat assembly according to FIG. 4.

FIGS. 7, 7b and 7c are top, side and end views of a cover member of the boat assembly.

DESCRIPTION

Figure 1:
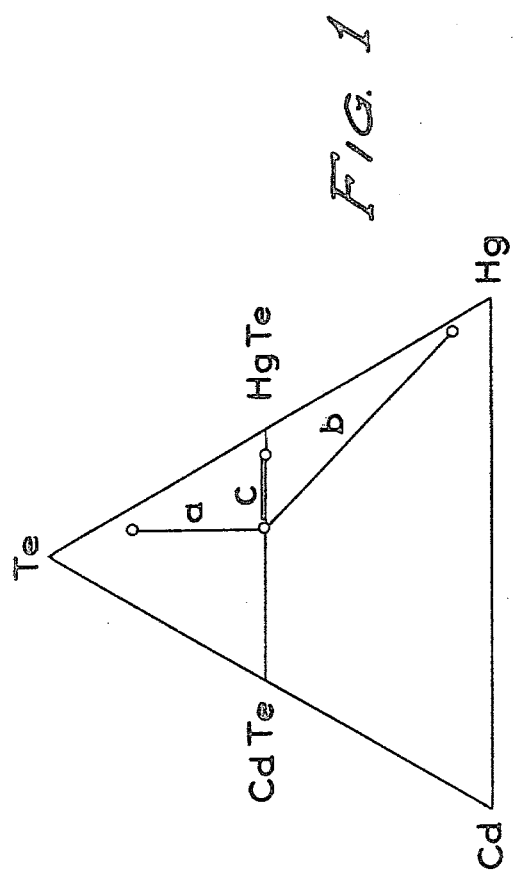
FIG. 1 is a schematic Hg-Cd-Te Ternary Phase Diagram showing three solutions which are in equilibrium with $Hg_{0.6}Cd_{0.4}Te$.
Figure 2:
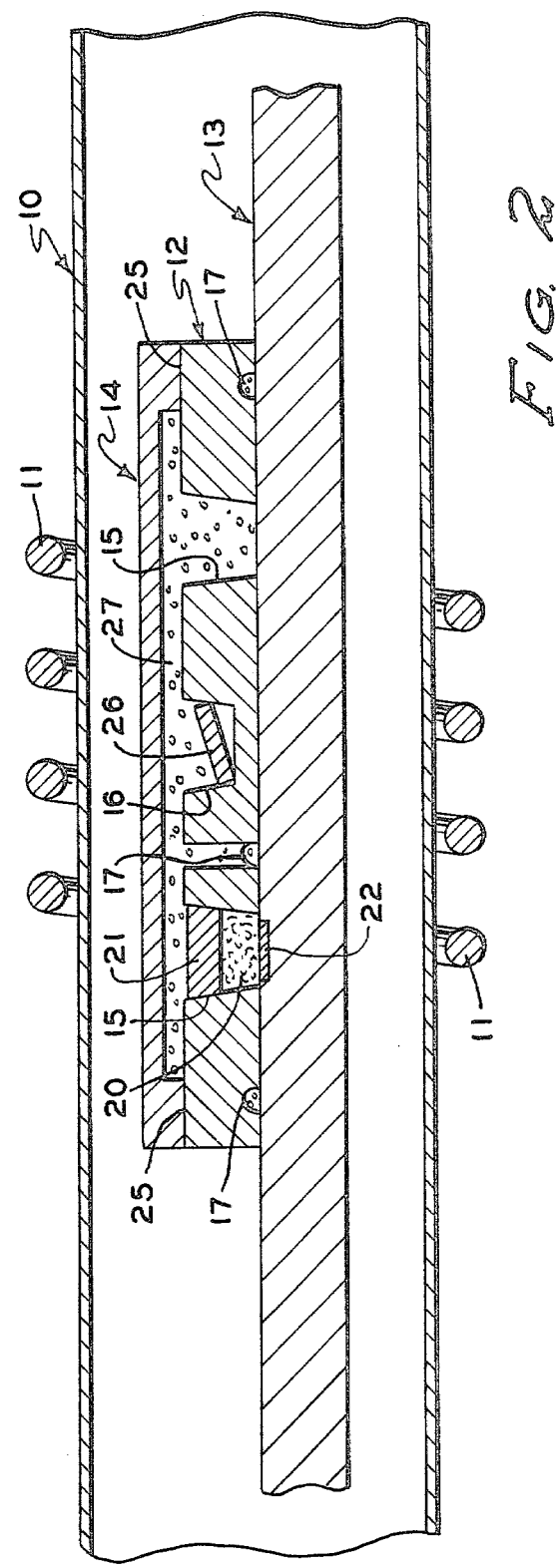
FIG. 2 is a sectional view of the covered boat for growing $Hg_{1-x}Cd_xTe$ by liquid phase epitaxy methods.
Figure 3:
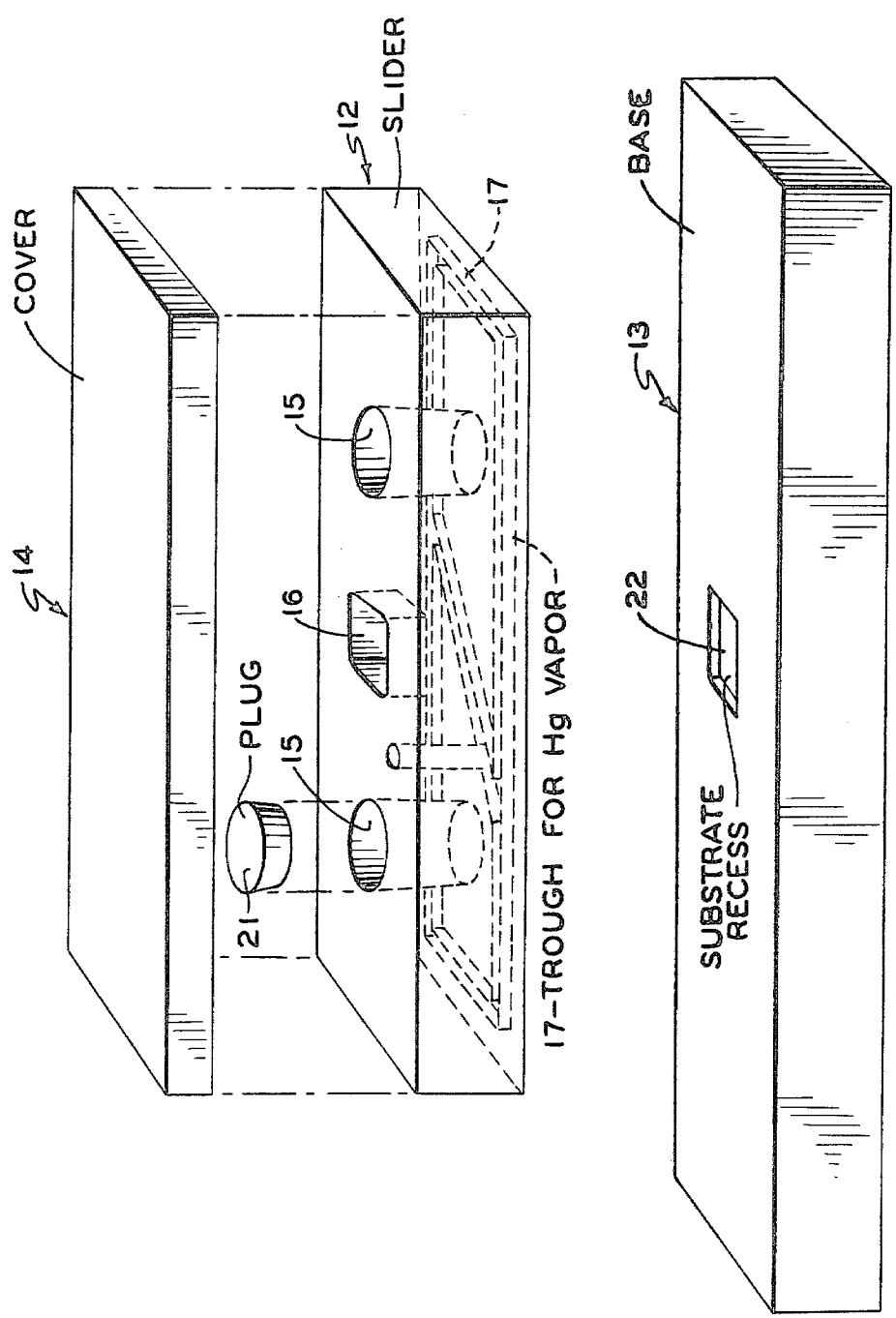
FIG. 3 is another view of the covered boat shown in FIG. 2.

Referring now to FIG. 2 there is shown the improved apparatus for slider growth of $Hg_{1-x}Cd_xTe$. A quartz tube 10, of which a partial section is shown, provides the conventional furnace enclosure within which the $Hg_{1-x}Cd_xTe$ is grown. A suitable source of heat, such as a heating coil 11 around the tube, provides the desired temperature for the liquid phase epitaxy growth of $Hg_{1-x}Cd_xTe$. The graphite furnace boat comprises a slider or carrier section 12, a base section 13, and a cover section 14. The slider section 12 has one or more wells 15 extending through the section, and has a more shallow well or depression 16. The bottom surface of the slider section 12 has a continuous trough or groove 17 therein looping around the bottom near the perimeter. A channel extending in a vertical direction through the slider section connects the groove 17 to the top surface. The well 15 is adapted to contain a growth solution 20 of $(Hg_{1-x}Cd_x)_{1-y}Te_y$. A plug 21 caps the well. The base section 13 of the boat has a recess 22 in the top surface thereof. The purpose of the recess is to receive a growth substrate, such as CdTe, upon which the LPE layer of $Hg_{1-x}Cd_xTe$ is epitaxially grown. The cover section 14 of the boat has a shoulder 25 on its lower face and extending around its perimeter which is machined to fit closely to the upper surface of the slider section 12.

When growing $Hg_{1-x}Cd_xTe$ in the apparatus of the present invention, a growth substrate is placed in the recess 22. A charge 20 of $(Hg_{1-x}Cd_x)_{1-y}Te_y$ is placed in the well 15 and the well capped with plug 21. It is necessary to prevent loss of Hg from the charge 20 during the growth procedure. A Hg source wafer 26 of HgTe plus Te is placed in shallow well 16. The cover 14 is placed over the slider 12 and the furnace boat is placed in the tube 10, is purged, and is heated to 500° C. A source of $H_2$ gas is caused to flow in the quartz tube. When the equilibration is reached, the slider is moved with respect to the base to position the well 15 with $(Hg_{1-x}Cd_x)_{1-y}Te_y$ charge 20 over the substrate in recess 22 so that the epitaxial growth can commence. The purpose of the source wafer 26 is to give up Hg thereby pressurizing the growth area, i.e., the region 27 under the cover 14, in the wells 15 of the slider and in the groove or moat 17 around the bottom of the slider. Since this is a slider assembly, some Hg vapor leaks and diffuses out of the boat through the cover fit or through the sliding fit between slider section 12 and base section 13 and into the $H_2$ gas stream contained in the quartz tube 10. The Hg which escapes is replaced by dissociation of the source wafer 26 to thereby maintain a constant Hg pressure over the plug 21, and around the growth solution 20 and growth substrate. Since the partial pressure of Hg from the source wafer 26 of HgTe is the same as the partial pressure of Hg from the charge 20, i.e. about 0.1 atm, there is prevented any loss of Hg from the charge 20 and the LPE grown layer of $Hg_{1-x}Cd_xTe$ on the substrate.

Figure 4:
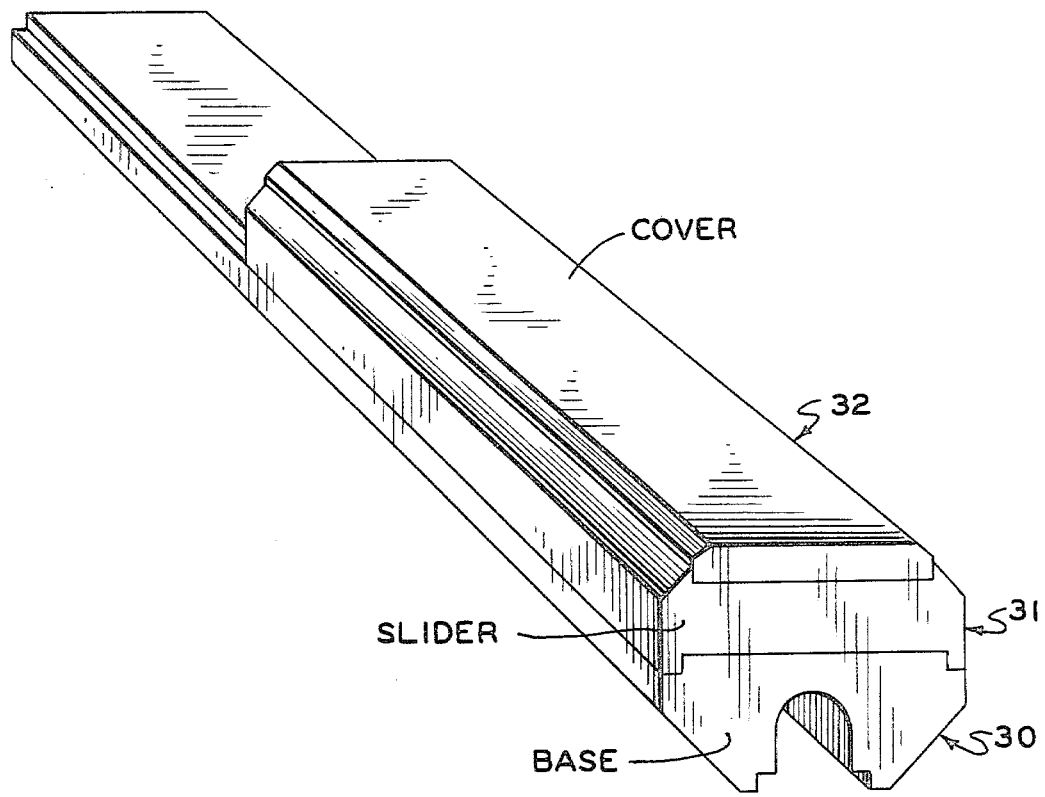
FIG. 4 is a pictorial view of a preferred embodiment of the boat assembly of the invention.

Referring now to FIG. 4 there is shown a more preferred embodiment of the boat assembly comprising major components including a base or stator member 30, a slider member 31 and a cover member 32. The details of the base member 30 are shown in FIGS. 5, 5b and 5c which are the top, side and end views, respectively. The base member has a long flat bed 40 broken by a recessed rectangular area 41 into which a semiconductor substrate wafer is placed and on which the liquid phase epitaxy layer of $Hg_{1-x}Cd_xTe$ is grown. The base member has recessed channels 42 and 43 along each edge of the bed.

Figure 6:
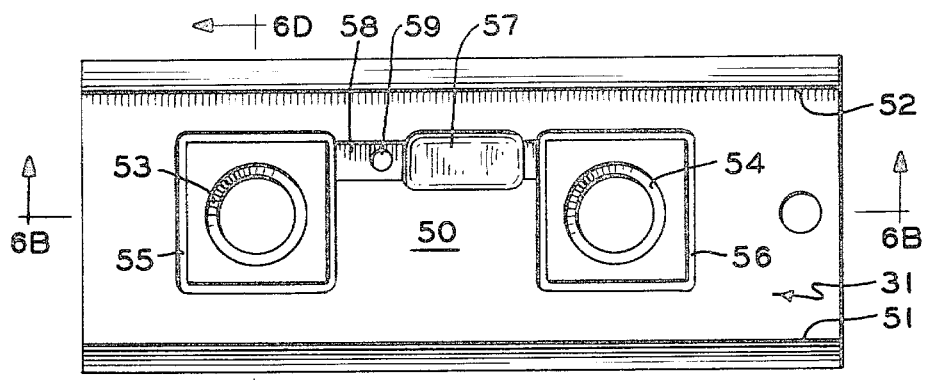
FIGS. 6, 6b and 6c are top, side and bottom views of the slider member of the boat assembly.
Figure 6B:
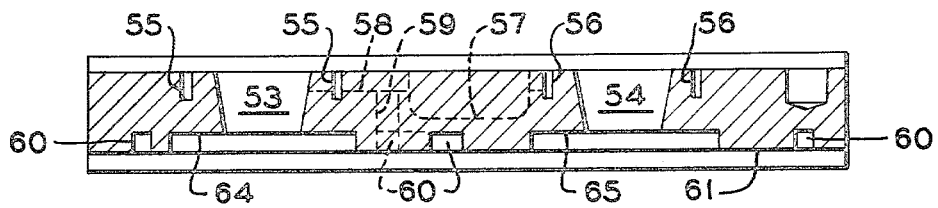
Figure 6C:
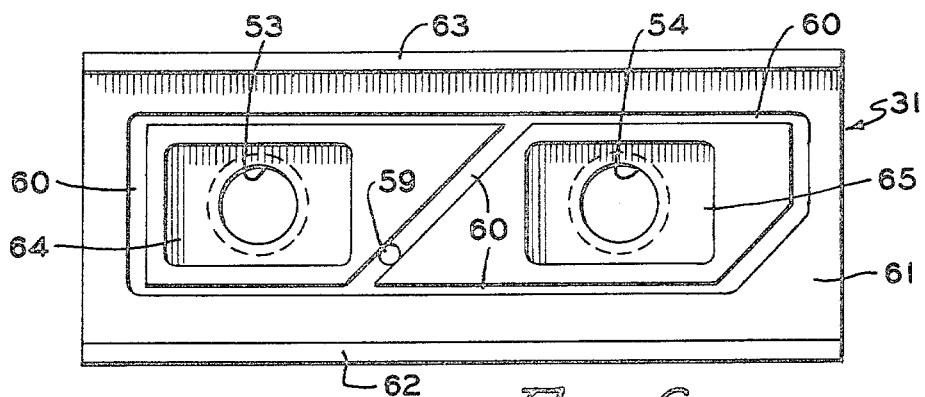
Figure 6D:
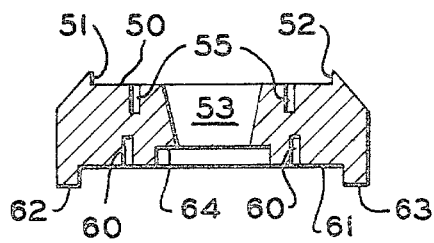
FIG. 6d is a section view through a portion of the slider member.
Figure 6E:
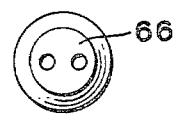
FIGS. 6e and 6f are top and side views of a plug designed to fit in the well of the slider member.
Figure 6F:

In FIGS. 6, 6b, 6c and 6d, there is shown the detail construction of the graphite slider member 31. From the top view, FIG. 6, there is seen a flat top surface 50 extending the length of the slider and having raised parallel guides 51 and 52 along opposite edges for the purpose of properly positioning the cover member. Two wells 53 and 54 are cut through from the top surface 50 to the bottom of the slider. The wells, as shown, are somewhat tapered, being of lesser diameter at the bottom. Surrounding the wells 53 and 54 on the top surface 50 are grooves or moats 55 and 56, respectively. Groove 55 completely encompasses well 53 and likewise groove 56 encompasses well 54. Located in the top surface 50 generally between the two wells is a shallow well 57 which communicates with grooves 55 and 56 by means of a shallow channel 58 milled into the top surface. Also, a hole 59 is drilled from the channel 58 through to a groove 60 cut into the lower face 61 of the slider member 31. The lower face, best seen in FIG. 6c, is generally planar and mates with and is slideable along the flat bed 40 of the base member 30. A pair of parallel guide members 62 and 63 (FIG. 6d) extend somewhat beyond the lower face 61 and are designed to fit in and slide along recessed channels 42 and 43. FIG. 6d is a sectional view through the slider at the position of the well 53. The groove or moat 60 in the lower face 61 completely surrounds the two wells 53 and 54. In the area of the wells 53 and 54 and inside of the groove 60, recessed rectangular areas 64 and 65 are cut. These recessed areas are preferably comparable in size with recessed area 41 in the base member 30. The dimensions of the recessed areas 41, 64 and 65 generally correspond to the size of the substrate upon which the $Hg_{1-x}Cd_xTe$ layer is to be grown. FIGS. 6e and 6f show a top view and an edge view, respectively, of a plug 66 which fits into the top of well 53.

FIGS. 7, 7b and 7c are the top, side and end views of the graphite cover member 32 for covering the top surface of the slider member 31. The bottom surface of the cover member is generally flat and designed to mate closely with the top surface 50 of the slider.

When growing $Hg_{1-x}Cd_xTe$ in the embodiment shown in FIGS. 4–5, a growth substrate is placed in the recess 41 and a charge of $(Hg_{1-x}Cd_x)_{1-y}Te_y$ is placed in the well 53 and the well capped with plug 66. A Hg source wafer of HgTe is placed in shallow well 57. The cover 32 is placed over slider 31 and the assembly is placed in the quartz tube 10. Before heating, the assembly is thoroughly purged with nitrogen. A source of H₂ is then caused to flow in the quartz tube, it is heated to 500° C. and when equilibration is reached, the slider 31 is adjusted longitudinally along base 30 to position the well 53 and recessed area 64 containing the melted charge of $(Hg_{1-x}Cd_x)_{1-y}Te_y$ over recess 41 containing the growth substrate so that epitaxial growth can commence. As an example, growth may continue about one half hour. As mentioned previously, the vapor pressure of the Hg is about 0.1 atm to prevent the Hg from escaping from the $(Hg_{1-x}Cd_x)_{1-y}Te_y$ charge, a Hg source wafer of HgTe is also included in shallow well 57. The Hg vapor pressure of HgTe is the same as that of $(Hg_{1-x}Cd_x)_{1-y}Te_y$, i.e. 0.1 atm at 500° C., so that grooves 55, 56 and 60 are pressurized with Hg to prevent the escape of Hg from the charge.

The temperature of 500° C. is used throughout as the growth temperature. Obviously, growth must occur from a solution at a temperature below its liquidus temperature $T_l$ and the liquidus temperature depends on composition. For example, the Table lists $T_l$ for 5 growth solutions of $(Hg_{1-x}Cd_x)_{1-y}Te_y$ which have been used to grow $Hg_{1-x}Cd_xTe$. These compositions have been selected to be near 500° C. but other compositions can be selected to have $T_l$ at 450° C. for example. In all cases growth must be at a temperature less than $T_l$. Thus the temperature of the $(Hg_{1-x}Cd_x)_{1-y}Te_y$ charge is initially raised by the furnace to a temperature above $T_l$ and is then dropped below $T_l$ during growth. These growth conditions can be by step cooling in which the liquid $(Hg_{1-x}Cd_x)_{1-y}Te_y$ is supercooled by a predetermined number of degrees below $T_l$ before the slider 31 is adjusted to bring the liquid charge over the growth substrate, or by beginning with the $(Hg_{1-x}Cd_x)_{1-y}Te_y$ solution at the liquidus temperature and slowly cooling below $T_l$ after the molten charge is brought in contact with the growth substrate, or again by a combination of the two.

TABLE

TIE LINE PARAMETERS. $(Hg_{1-x}Cd_x)_{1-y}Te_y$
FOR SOLUTION, $Hg_{1-x}Cd_xTe$ FOR SOLID

| Source Solution | | | Solid Grown | Ratio, k |
|---|---|---|---|---|
| x | y | $T_l$ | x | $x_s/x_l$ |
| 0.1 | 0.825 | 508° C. | 0.40 | 4.00 |
| 0.095 | 0.82 | 508° C. | 0.37 | 3.89 |
| 0.082 | 0.81 | 507° C. | 0.29 | 3.54 |
| 0.06 | 0.80 | 510° C. | 0.22 | 3.67 |
| 0.05 | 0.80 | 499° C. | 0.195 | 3.90 |

Thus in summary we utilize the rather surprising fact that mercury vapor pressure over $(Hg_{1-x}Cd_x)_{1-y}Te_y$ at a given temperature is substantially independent of x and y for y values greater than 0.5. Obviously if x=1 or y=1 in the above formula then no mercury is present and the mercury pressure will drop. Since the mercury pressure is independent of x and y over a large range, then HgTe or HgTe plus Te can provide the Hg vapor over a growth solution of $(Hg_{1-x}Cd_x)_{1-y}Te_y$ to prevent the loss of Hg from it. As Hg is lost from a HgTe source, the source becomes richer in Te, but the Hg vapor pressure remains constant. Thus it is not necessary to control the exact composition of the Hg source. This phenomena of mercury pressure being independent of x and y holds true over a wide range of temperatures.

The embodiments of the invention in which an exclusive property or right is claimed are defined as follows:

1. In a method of mercury containment in the liquid phase epitaxial growth of mercury cadmium telluride from a tellurium-rich solution having steps including,
   providing a slider type graphite boat for use in a liquid phase epitaxy growth furnace,
   providing a well through the graphite boat,
   providing a charge of Te-rich $(Hg_{1-x}Cd_x)_{1-y}Te_y$ into the well and providing a plug over the charge,
   providing a boat base-member having a recess therein and providing a semiconductor substrate in said recess, the base member and boat being slideably movable one with respect to the other to allow orientation of the well and recess when desired, so that when oriented, $Hg_{1-x}Cd_xTe$ can grown on said substrate,
   providing a graphite cover over the graphic boat, and heating the boat in the growth furnace; the improvement comprising the step of
   providing another mercury supplying charge beneath the cover to generate a Hg vapor pressure approximately equal to the Hg vapor pressure arising from the $(Hg_{1-x}Cd_x)_{1-y}Te_y$ charge to thereby contain and preclude loss of Hg from the charge of Te-rich $(Hg_{1-x}Cd_x)_{1-y}Te_y$.

2. In a method for mercury containment in the liquid phase epitaxial growth of mercury cadmium telluride from a tellurium-rich solution having steps including, providing a charge of Te-rich $(Hg_{1-x}Cd_x)_{1-y}Te_y$ for use in a slider type liquid phase epitaxy growth furnace; the improvement comprising the steps of providing a mercury supplying charge to generate a Hg vapor pressure approximately equal to the Hg vapor pressure arising from the $(Hg_{1-x}Cd_x)_{1-y}Te_y$ charge; and surrounding the charge of Te-rich $(Hg_{1-x}Cd_x)_{1-y}Te_y$ with the Hg vapor pressure dissociated from the mercury supplying charge to preclude loss of Hg from the charge of Te-rich $(Hg_{1-x}Cd_x)_{1-y}Te_y$.

3. In a method of mercury containment in the liquid phase epitaxial growth of mercury cadmium telluride from a tellurium-rich solution having steps including, providing a slider type graphite boat assembly for use in a liquid-phase epitaxy growth furnace;

providing a chamber for containing a charge of $(Hg_{1-x}Cd_x)_{1-y}Te_y$ in a first section of the assembly;

providing a growth substrate in a second section of the assembly;

sealing the chamber with the second section;

heating the growth furnace and boat assembly to near 500° C., a Hg vapor pressure of about 0.1 atm being generated and tending to escape through the seal;

slideably adjusting the first and second sections with respect to one another and bringing the charge of $(Hg_{1-x}Cd_x)_{1-y}Te_y$ in contact with the growth substrate thereby, to initiate the HgCdTe growth on the substrate; the improvement comprising the step of providing another source of Hg vapor from a mercury supplying charge surrounding the chamber seal to prevent Hg from escaping from the chamber.

4. The method of claim 1 wherein the step of heating the boat in the furnace further comprises initially increasing the temperature of the $(Hg_{1-x}Cd_x)_{1-y}Te_y$ to exceed the liquidus temperature and then controlling at a constant temperature below the liquidus temperature of the $(Hg_{1-x}Cd_x)_{1-y}Te_y$ growth solution.

5. The method of claim 1 wherein the step of heating the boat in the furnace further comprises initially increasing the temperature of the $(Hg_{1-x}Cd_x)_{1-y}Te_y$ to exceed the liquidus temperature and then slowly cooling below the liquidus temperature of the HgCdTe growth solution.

6. The method of claim 1, 2 or 3 wherein the mercury supplying charge provided consists of HgTe.

7. The method of claim 1, 2 or 3 wherein the mercury supplying charge provided consists of HgTe plus tellurium.

* * * * *